United States Patent [19]

Kitano

[11] Patent Number: 4,801,872
[45] Date of Patent: Jan. 31, 1989

[54] GUIDED-WAVE ACOUSTOOPTIC SPECTRUM ANALYZER

[75] Inventor: Toshihiko Kitano, Tokyo, Japan

[73] Assignee: NEC Corporation, Japan

[21] Appl. No.: 70,960

[22] Filed: Jul. 8, 1987

[30] Foreign Application Priority Data

Jul. 9, 1986 [JP]  Japan ................................ 61-159741
Jul. 31, 1986 [JP]  Japan ................................ 61-181320
Sep. 16, 1986 [JP]  Japan ................................ 61-218400

[51] Int. Cl.⁴ ............................................ G01R 23/16
[52] U.S. Cl. ................................... 324/77 K; 333/151; 350/96.11; 350/353
[58] Field of Search ................... 310/313 A; 333/151; 350/96.11, 96.12, 96.13, 96.14, 96.17, 96.18, 96.19, 353, 355, 356; 324/77 K

[56] References Cited

U.S. PATENT DOCUMENTS

| | | | |
|---|---|---|---|
| 4,198,634 | 4/1980 | Jernigan et al. | 324/77 K |
| 4,253,060 | 2/1981 | Chen | 324/77 K |
| 4,297,704 | 10/1981 | Marom et al. | 324/77 K |
| 4,348,074 | 9/1982 | Burns et al. | 324/77 K |
| 4,394,060 | 7/1983 | Verber et al. | 324/77 K |
| 4,501,987 | 2/1985 | Mitsuyu et al. | 333/151 |

OTHER PUBLICATIONS

Guided-Wave Acoustooptic Bragg Modulators for Wide-Band Integrated Optic Communications and Signal Processing, by Shen S. Tsai, IEEE Transaction on Circuits & Systems, vol. Cas-26, No. 12, Dec. 1979.

Primary Examiner—Michael J. Tokar
Attorney, Agent, or Firm—Ostrolenk, Faber, Gerb & Soffen

[57] ABSTRACT

A guided-wave acoustooptic spectrum analyzer comprises a planar optical waveguide layer with electrodes of a transducer thereon. The electrodes are positioned at the center of a light path under which light is propagated. The light is deflected in response to frequencies of electric signals applied to the electrodes. With the invention, the detectable minimum pulses width of a pulse signal is reduced as compared with the prior art, while the frequency resolution therein is maintained at the same level.

6 Claims, 6 Drawing Sheets

GUIDED-WAVE ACOUSTOOPTIC SPECTRUM ANALYZER

FIELD OF THE INVENTION

The invention relates to a guided-wave acoustooptic (AO) spectrum analyzer, and more particularly to a guided-wave acoustooptic spectrum analyzer in which light is deflected in response to the frequencies of surface acoustic wave.

BACKGROUND OF THE INVENTION

Several conventional guided-wave acoustooptic spectrum analyzers are described on pages 1072 to 1098 of "IEEE TRANSACTIONS ON CIRCUITS AND SYSTEMS, VOL. CAS-26. No. Dec. 12, 1979". One of the guided-wave acoustooptic spectrum analyzers comprises a Ti-diffused LiNbO$_3$ waveguide, a pair of waveguide lenses, a transducer for producing surface acoustic wave (simply called "SAW" hereinafter), a laser diode for radiating light, guiding of which is provided by butt-coupling of the laser diode to a substrate, and a photodetector array for detecting light which is deflected in response to the frequencies of the SAW.

In operation, the light radiated from the laser diode propagates through the Ti-diffused LiNbO$_3$ waveguide, and beams thereof are made parallel by the first lens of the pair of the waveguide lenses. The light that has thus passed through the first lens is deflected by the SAW.

The extent of the deflection is responsive to the frequency of the SAW produced by the transducer. The light thus deflected is focused on the photodetector array so that the frequency spectrum of the light can be analyzed in real time in accordance with the position of the light receiving section of the photodetector array, which depends in turn upon the extent of deflection of the light.

According to the guided-wave acoustooptic spectrum analyzer described above, the frequency resolution $\delta_f$ is determined by the equation (1).

$$\delta_f = \frac{\pi}{4} \frac{V}{W} \quad (1)$$

where V is a propagating velocity of the SAW, and W is a width of the light beams which are made parallel by the first lens.

In a case where a pulse signal is applied to the transducer, a detectable minimum value $\tau_{min}$ of the pulse width therein is determined by the equation (2).

$$\tau_{min} = \frac{W}{V} \quad (2)$$

Therefore, the foregoing system has the disadvantage that the minimum value $\tau_{min}$ can not be smaller than a certain level, which depends upon the frequency resolution $\delta_f$, since the resolution $\delta_f$ is proportional to the width W of the collimated light beam, while the minimum value $\tau_{min}$ of the pulse width is inversely proportional to the width W.

A further disadvantage is present in the guided-wave acoustooptic spectrum analyzer described above, namely that the availability of the SAW is not sufficient because the SAW which are propagated in a direction away from the light path between the pair of waveguide lenses is absorbed.

There is a still further disadvantage in the guided-wave acoustooptic spectrum analyzer described above, namely that the light is scattered by the Ti-diffused LiNbO$_3$ waveguide, if electrodes of the transducer are provided in the light path between the pair of the waveguide lenses. This is in contrast to certain features of the invention to be described in detail later.

SUMMARY OF THE INVENTION

Accordingly, it is an object of the invention to provide a guided-wave acoustooptic spectrum analyzer in which a detectable minimum pulse width of a pulse signal is lowered.

It is a further object of the invention to provide a guided-wave acoustooptic spectrum analyzer in which the availability of SAW is increased.

It is a still further object of the invention to provide a guided-wave acoustooptic spectrum analyzer in which the scattering of light is prevented from being occurring even if electrodes of a transducer are provided in a light path.

According to the invention, a guided-wave acoustooptic spectrum analyzer comprises, a planar optical waveguide layer provided on a substrate, a light source for radiating light to be propagated through said planar optical waveguide layer, a lens for converting said light which is propagated through said planar optical waveguide layer into a collimated light beam, deflecting means for deflecting said collimated light beam in response to frequencies of surface acoustic wave produced by electic signals applied thereto, said deflecting means being positioned at the center of a light path under which said collimated light beam is propagated, and a photodetector array for detecting said light deflected by said deflecting means thereby producing signals representative of the frequency spectrum of said electric signals.

BRIEF DESCRIPTION OF THE DRAWINGS

The invention will be explained in more detail in accordance with following drawings wherein.

DESCRIPTION OF THE PREFERRED EMBODIMENT

Figure 1:
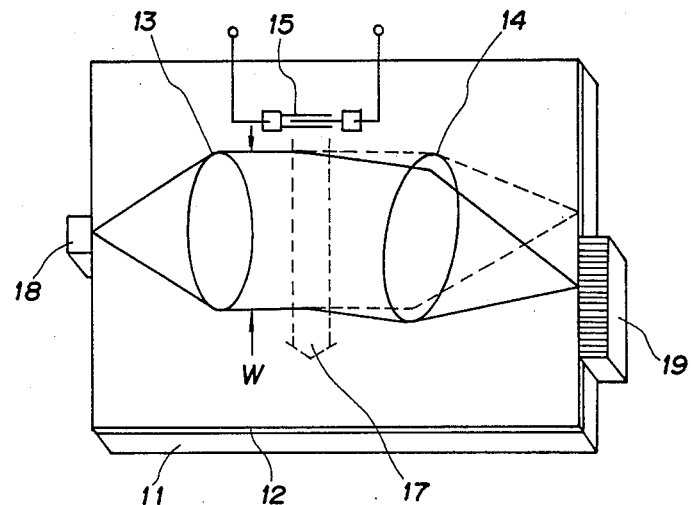
FIG. 1 is an explanatory view illustrating a conventional guided-wave acoustooptic spectrum analyzer.

Before explaining the preferred embodiments according to the invention, the aforementioned conventional guided-wave acoustooptic spectrum analyzer will be explained, with reference to FIG. 1. The guided-wave acoustooptic spectrum analyzer comprises a substrate 11 of LiNbO$_3$ which is a ferroelectric material, a planar optical waveguide layer 12 comprising Ti diffused into the substrate 11, a pair of planar lenses 13 and 14, electrodes 15 of a transducer for producing SAW 17, a light source 18 such as a semiconductor laser from which light is radiated, and a photodetector array 19 for detecting light deflected by the SAW. The planar lenses 13 and 14 are usually geodesic lenses, each being provided by a hollow formed on the substrate 11, or they may be replaced by a chirp grating lens utilizing a non-periodic grating, etc.

In operation, the light radiated from the light source 18 is propagated through the planar optical waveguide layer 12, and beams thereof are made parallel by the planar lens 13. The collimated light beam is deflected in response to frequencies of the SAW 17 radiated by the electrodes 15, which in turn is responsive to the frequencies of electric signals applied to the electrodes 15. The light thus deflected is focused on the photodetector array 19 by the planar lens 14, whereby the frequency spectrum of the electric signal is analyzed in real time in accordance with the position of the light receiving section of the photodetector array 19, depending in turn upon the extent of the light deflection.

This conventional guided-wave acoustooptic spectrum analyzer, however, has the aforementioned disadvantages in regard to the relation between the frequency resolution and minimum pulse width, and in regard to the availability of the SAW. The reference letter W indicates the width of the collimated light beam as described in the equations (1) and (2).

Figure 2:
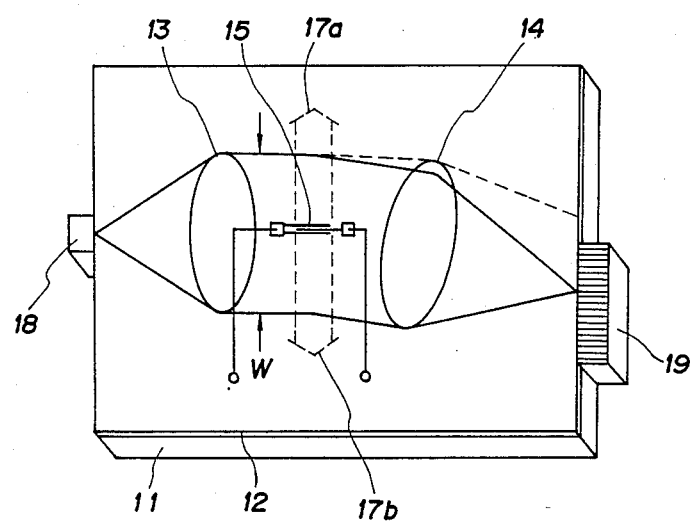
FIG. 2 is an explanatory view illustrating a guided-wave acoustooptic spectrum analyzer according to a first embodiment of the invention.

Next, there is shown a guided-wave acoustooptic spectrum analyzer according to a first embodiment of the invention in FIG. 2. Like parts are indicated by like reference numerals in the various Figures and repetitive explanations are omitted. In FIG. 2, the electrodes 15 are positioned in the center of the light path under which the light of beams made parallel by the planar lens 13 is propagated.

In operation, the collimated light beam comprising light beams which are made parallel by the planar lens 13 is deflected by the SAWs 17a and 17b propagated in the upper and lower directions respectively (as seen in FIG. 2) so that the light thus deflected is detected by the photodetector array 19.

In the analysis of the frequency spectrum of electric signals to be applied to the electrodes 15, the frequency resolution $\delta_f$ is determined by the aforementioned equation (1).

On the other hand, the detectable minimum pulse width $\tau_{min}$ of a pulse signal is determined by the following equation (3). Equation (3) is a modification of the aforementioned equation (2) for the reason that the width W of the collimated light beam is substantially half, as compared to the conventional spectrum analyzer.

$$\tau_{min} = \frac{1}{2} \cdot \frac{W}{V} \tag{3}$$

Therefore, the minimum pulse width $\tau_{min}$ is reduced by half, while the frequency resolution $\delta_f$ is maintained at the same level.

Figure 3:
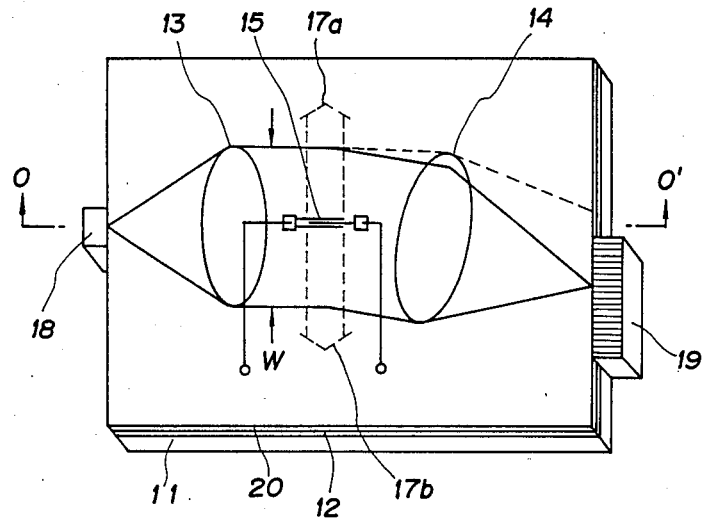
FIG. 3 is an explanatory view illustrating a guided-wave acoustooptic spectrum analyzer according to a second embodiment of the invention.

FIG. 3 shows a guided-wave acoustooptic spectrum analyzer according to a second embodiment of the invention. The guided-wave acoustooptic spectrum analyzer further comprises a surface layer 20 having a lower refractive index than that of the planar optical waveguide layer 12, in addition to the construction shown in FIG. 2. The surface layer 20 is provided on the planar optical waveguide layer 12 and is formed by diffusing MgO into the Ti-diffused optical waveguide layer 12.

Figure 4A:
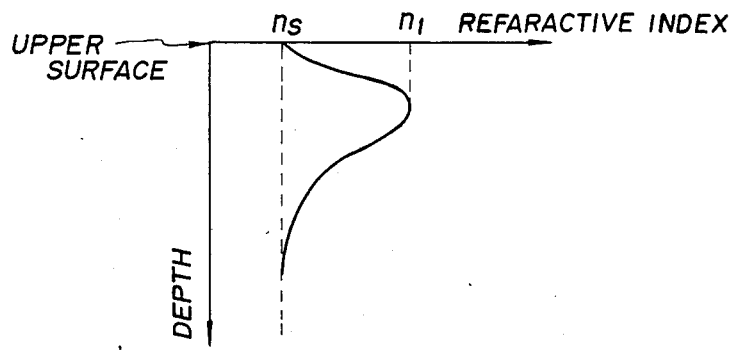
FIGS. 4A and 4B are explanatory diagrams showing refractive index and intensity of light as a function of the depth of a substrate according to the second embodiment of the invention.
Figure 4B:
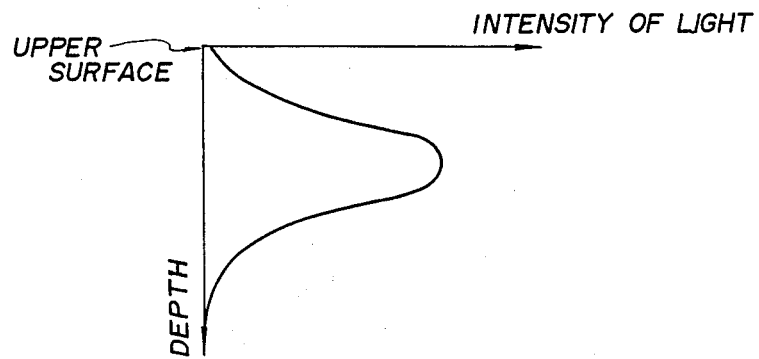

As a result, the refractive index of the surface layer 20 is approximately $n_s$ (equal to that of the substrate 11), while that of the planar optical waveguide layer 12 is $n_1$, which is higher than $n_s$ as shown in FIG. 4A. Accordingly, the intensity of light is substantially negligible in the upper surface layer, while the light intensity in the planar optical waveguide layer 12 is much higher as shown in FIG. 4B.

For this reason, the scattering of light is prevented from occurring even if the electrodes 15 are positioned at the center of the light path as illustrated in FIG. 3.

Figure 5A:
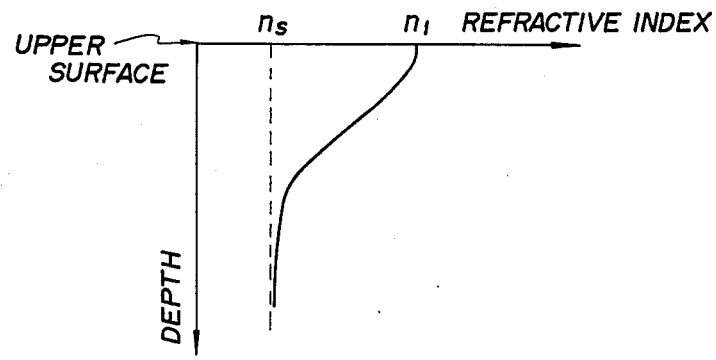
FIGS. 5A and 5B are explanatory diagrams showing refractive index and intensity of light as a function of the depth of a substrate having no surface layer according to the second embodiment of the invention.
Figure 5B:
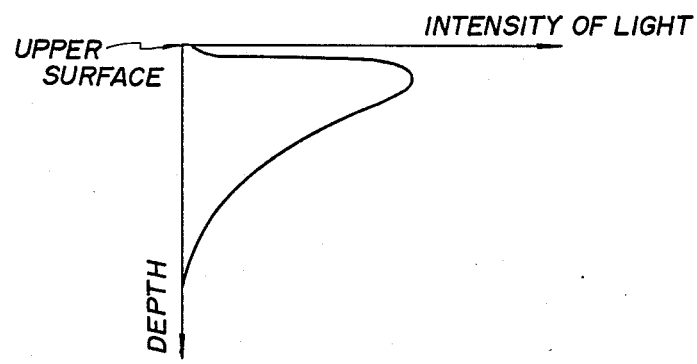

On the contrary, the refractive index is the largest value $n_1$ at the upper surface of the planar optical waveguide layer 12 as shown in FIG. 5A, if such a surface layer 20 is not provided. As a result, the intensity of light is the largest in the vicinity of the upper surface of the substrate as shown in FIG. 5B, so that to an extent the scattering of light can not be avoided.

The guided-wave acoustooptic spectrum analyzer in FIG. 3 is fabricated as shown in FIGS. 6A to 6E.

Figure 6A:
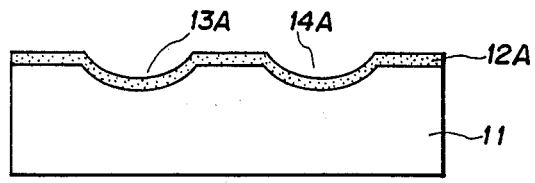
FIGS. 6A to 6E are cross sectional views taken along the line O—O' and explaining a method of fabricating the guided-wave acoustooptic spectrum analyzer according to the second embodiment of the invention.
Figure 6B:
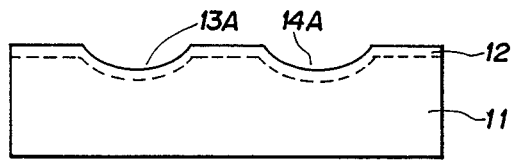
Figure 6C:
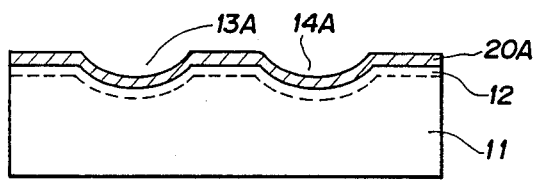
Figure 6D:
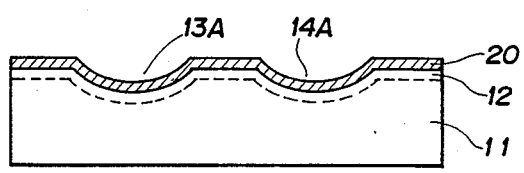
Figure 6E:
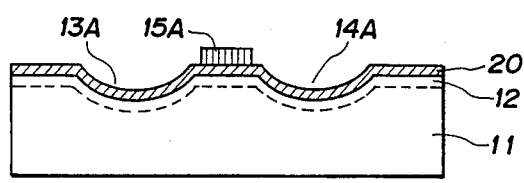

First, a substrate 11 of LiNbO$_3$ is subjected to machining by a diamond cutting tool to be provided on its surface with hollows 13A and 14A, and then is optically polished on its surface, including the surfaces of the hollows 13A and 14A. Thereafter the subtrate 11 is coated on its whole surface with a Ti layer 12A to a thickness of 200 to 1000 Å as shown in FIG. 6A and then treated for 1 to 8 hours so as to produce a Ti-diffused layer 12, by heating at 1,000° to 1,100° C. as shown in FIG. 6B. Next, a layer 20A of MgO is formed on the Ti-diffused layer 12 to a thickness of 10 to 1000 Å as shown in FIG. 6C and is then treated in a diffusing furnace for 1 to 8 hours by heating at 800° to 1,000° C. so that the substrate 11 is diffused with MgO to result in an MgO-diffused layer 20 in the Ti-diffused layer 12 as shown in FIG. 6D. Finally, a thin metal layer 15A is provided on the surface of the MgO-diffused layer 20 in order to make electrodes, as shown in FIG. 6E. Then a semiconductor laser, which embodies a light source and a photodetector array for photoelectric conversion, are polished and then fixed to the both side surfaces of the substrate 11.

A guided-wave acoustooptic spectrum analyzer according to a third embodiment of the invention is fabricated as shown in FIGS. 7A to 7E.

Figure 7A:
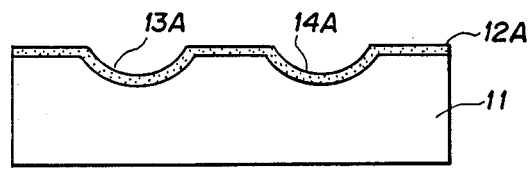
FIGS. 7A to 7E are cross sectional views showing a method of fabricating a guided-wave acoustooptic spectrum analyzer according to a third embodiment of the invention.
Figure 7B:
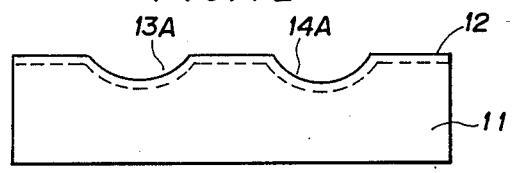
Figure 7C:
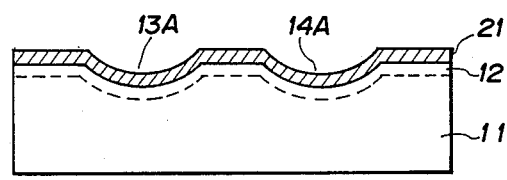
Figure 7D:
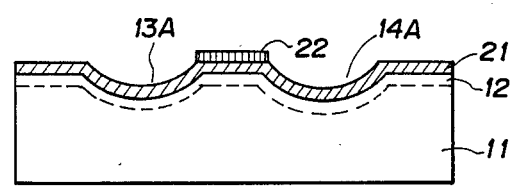
Figure 7E:
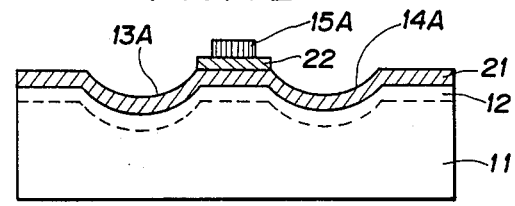

First, a substrate 11 of LiNbO$_3$ is subjected to machining by a diamond cutting tool to be provided on its surface with hollows 13A and 14A, and then is optically polished on its surface, including the surfaces of the hollows 13A and 14A. Thereafter, the substrate 11 is coated on its whole surface with a Ti layer 12A to a thickness of 200 to 1,0000 Å as shown in FIG. 7A and then treated for 1 to 8 hours so as to produce a Ti-diffused layer 12, by heating at 1,000° to 1,100° C. as shown in FIG. 7B. Next, a buffer layer 21 of a material such as SiO$_2$, Al$_2$O$_3$ etc. which is transparent not to absorb light and has a lower refractive index than the LiNbO$_3$-substrate 11 is provided on the Ti-diffused layer 12 as shown in FIG. 7C. The buffer layer 21 does not have a piezo-electric characteristic because a material for the buffer layer 21 is usually in the amorphous form. For this reason, a thin piezo-electric film 22 of, for instance, an oriented ZnO film is provided on a predetermined region of the buffer layer 21 as shown in FIG. 7D. Finally, a thin metal layer 15A to be made into electrodes is provided on the thin piezo-electric film 22 as shown in FIG. 7E. Then, a semiconductor laser which embodies a light source, and a photodetector array for photoelectric conversion, are polished and then fixed to both side surfaces of the substrate 11.

Figure 8:
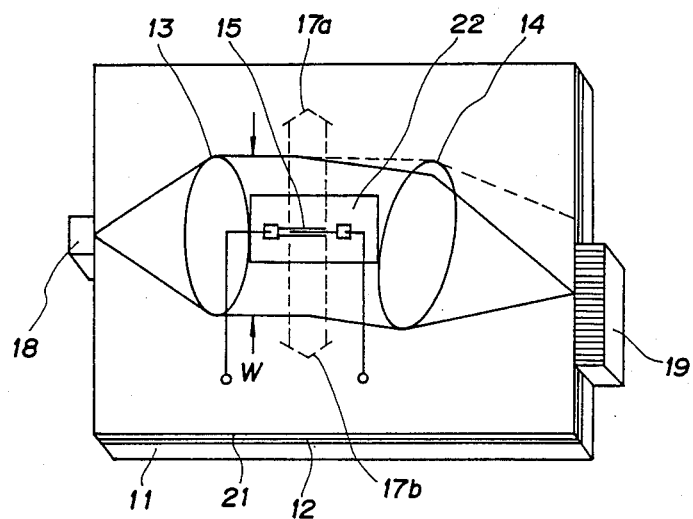
FIG. 8 is an explanatory view showing the guided-wave acoustooptic spectrum analyzer according to the third embodiment of the invention.

In FIG. 8, there is shown the guided-wave acoustooptic spectrum analyzer thus fabricated in which SAW are effectively produced by the electrodes 15 provided on the piezo-electric layer 22, although the buffer layer 21 does not have a piezo-electric characteristic.

Figure 9A:
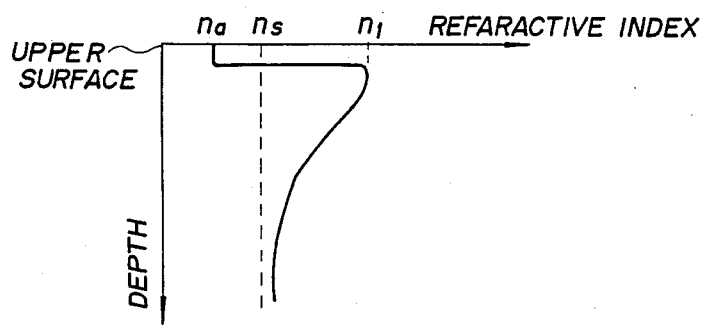
FIGS. 9A and 9B are explanatory diagrams showing refractive index and intensity of light as a function of the depth of a substrate in the guided-wave acoustooptic spectrum analyzer according to the third embodiment of the invention.
Figure 9B:
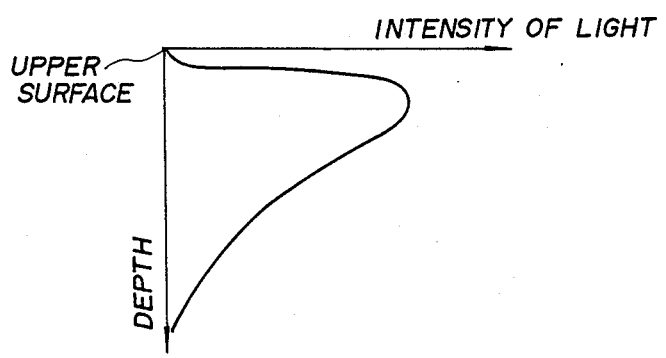

FIG. 9A shows refactive index as a function of depth of the substrate 11 in the guided-wave acoustooptic spectrum analyzer in FIG. 8. As clearly shown therein, the buffer layer 21 has a constant refractive index $n_a$ through the entire thickness thereof, which is smaller than the refractive index $n_s$ of the substrate 11, while the refractive index of the Ti-diffused layer 12 is increased sharply up to the highest value $n_1$ and then is gradually decreased down nearly to the refractive index $n_s$ of the substrate 11. Consequently, there is no light in the buffer layer 21, substantially as shown in FIG. 9B, so that the light is not scattered even if the electrodes are provided at the center of the light path on the substrate 11.

In the embodiments described above, although LiNbO$_3$ is used for the substrate 11, a ferroelectric material such as LiTaO$_3$, a semiconductor such as Si, or GaAs, or an inorganic material such as glass etc. may be used in place thereof. In such a case, for providing an optical waveguide layer 12, the Ti of the foregoing embodiments will be replaced by a material corresponding to the substrate 11.

Further, although two geodesic lenses are used, one or three geodesic lenses may be adopted, for instance.

Although the invention has been described with respect to specific embodiments thereof to provide a complete and clear disclosure, the appended claims are not thus limited but are to be construed as embodying all modifications and alternative contructions that may occur to one skilled in the art which fairly fall within the basic teaching herein set forth.

What is claimed is:

1. A guided-wave acoustooptic spectrum analyzer comprising,
   a planar optical waveguide layer provided on a substrate,
   a light source for radiating light to be propagated through said planar optical waveguide layer,
   a lens for converting said light which is propagated through said planar optical waveguide layer into parallel beams,
   deflecting means for deflecting said parallel beams in response to frequencies of surface acoustic waves produced by electric signals applied to said deflecting means, said deflecting means being positioned adjacent the center of a light path under which said parallel beams are propagated, and
   a photodetector array for detecting said light deflected by said deflecting means, thereby producing signals indicative of the frequency spectrum of said electric signals.

2. A guided-wave acoustooptic spectrum analyzer comprising,
   a planar optical waveguide layer provided on a substrate,
   a light source for radiating light to be propagated through said planar optical waveguide layer,
   a first lens for converting said light which is propagated through said planar optical waveguide layer into parallel beams,
   deflecting means for deflecting said parallel beams in response to frequencies of surface acoustic waves produced by electric signals applied to said deflecting means, said deflecting means being positioned adjacent the center of a light path under which said parallel beams are propagated,
   a second lens for focusing said light deflected by said deflecting means on a predetermined line, and
   a photodetector array for detecting said light focused by said second lens, thereby producing signals indicative of the frequency spectrum of said electric signals, said photodetector array being positioned along said predetermined line.

3. A guided-wave acoustooptic spectrum analyzer according to claim 2, further comprising,
   a surface layer provided on said planar optical waveguide layer, the refractive index of said surface layer being lower than that of said planar optical waveguide layer.

4. A guided-wave acoustooptic spectrum analyzer according to claim 3,
   wherein said planar optical waveguide layer is a Ti-diffused layer of a LiNbO$_3$ substrate, and said surface layer is a layer diffused with MgO into said Ti-diffused layer of said LiNbO$_3$ substrate.

5. A guided-wave acoustooptic spectrum analyzer according to claim 2, further comprising,
   a buffer layer provided on said planar optical waveguide layer, said buffer layer being transparent and having no piezo-electric characteristic, and the refractive index thereof being lower than that of said substrate, and
   a thin piezo-electric film, provided on a predetermined region of said buffer layer, said deflecting means being provided on said thin piezo-electric film.

6. A guided-wave acoustooptic spectrum analyzer according to claim 5,
   wherein said planar optical waveguide layer is a Ti-diffused layer of a LiNbO$_3$ substrate, and said buffer layer comprises a material selected from the group consisting of SiO$_2$ and Al$_2$O$_3$.

* * * * *